(12) United States Patent
Subramanian

(10) Patent No.: US 8,084,382 B2
(45) Date of Patent: *Dec. 27, 2011

(54) CERAMIC POWDER, CERAMIC LAYER AND LAYER SYSTEM WITH PYROCHLORE PHASE AND OXIDES

(75) Inventor: Ramesh Subramanian, Oviedo, FL (US)

(73) Assignee: Siemens Aktiengesellschaft, Munich (DE)

( * ) Notice: Subject to any disclaimer, the term of this patent is extended or adjusted under 35 U.S.C. 154(b) by 812 days.

This patent is subject to a terminal disclaimer.

(21) Appl. No.: 12/151,423

(22) Filed: May 6, 2008

(65) Prior Publication Data

US 2010/0297409 A1 Nov. 25, 2010

Related U.S. Application Data

(60) Provisional application No. 60/928,086, filed on May 7, 2007.

(30) Foreign Application Priority Data

May 7, 2007 (EP) .................................... 07009129

(51) Int. Cl.
C04B 35/48 (2006.01)
C04B 35/50 (2006.01)
(52) U.S. Cl. ......... 501/103; 501/134; 501/152; 428/702
(58) Field of Classification Search .................. 501/103, 501/134, 152; 428/469, 472, 702
See application file for complete search history.

(56) References Cited

U.S. PATENT DOCUMENTS

| | | | |
|---|---|---|---|
| 6,024,792 A | | 2/2000 | Kurz et al. |
| 7,592,071 B2 * | | 9/2009 | Kaiser et al. .................. 428/469 |
| 2004/0106015 A1 | | 6/2004 | Damani et al. |
| 2009/0176059 A1 * | | 7/2009 | Namba et al. .................. 428/155 |
| 2010/0296943 A1 * | | 11/2010 | Lee et al. .................. 416/241 R |
| 2010/0297410 A1 * | | 11/2010 | Subramanian ................ 428/213 |

FOREIGN PATENT DOCUMENTS

| | | |
|---|---|---|
| DE | 202005020695 U1 | 6/2006 |
| DE | 202006009526 U1 | 9/2006 |
| DE | 202006009527 U1 | 9/2006 |
| DE | 202006009603 U1 | 12/2006 |
| EP | 0 412 397 B1 | 2/1991 |
| EP | 0 486 489 B1 | 5/1992 |
| EP | 0 786 017 B1 | 7/1997 |
| EP | 0 892 090 A1 | 1/1999 |
| EP | 0 944 746 B1 | 9/1999 |
| EP | 0 992 603 A1 | 4/2000 |
| EP | 1 204 776 B1 | 5/2002 |
| EP | 1 306 454 A1 | 5/2003 |
| EP | 1 319 729 A1 | 6/2003 |
| EP | 1 783 248 A1 | 5/2007 |
| EP | 1 806 432 A1 | 7/2007 |
| EP | 1 806 435 A2 | 7/2007 |
| JP | 2007270245 * | 10/2007 |
| WO | WO 99/67435 A1 | 12/1999 |
| WO | WO 00/44949 A1 | 8/2000 |
| WO | WO 2005/019370 A2 | 3/2005 |

* cited by examiner

Primary Examiner — Karl E Group

(57) ABSTRACT

There is described a Ceramic Powder, a Ceramic Layer and a Layer System with Pyrochlore Phase and Oxides. Besides a good thermal insulation property, thermal insulation layer systems must also have a long lifetime of the thermal insulation layer. A described layer system has a layer sequence of a metallic bonding layer, an inner ceramic layer and an outer ceramic layer, which are specially matched to one another.

18 Claims, 4 Drawing Sheets

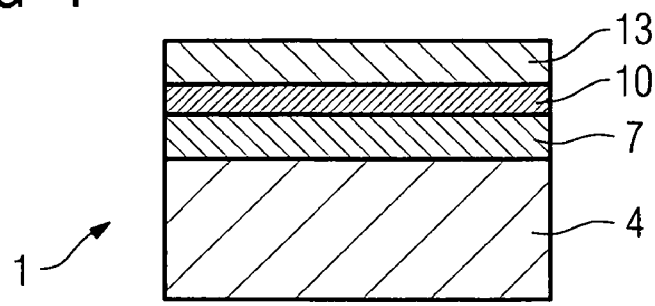
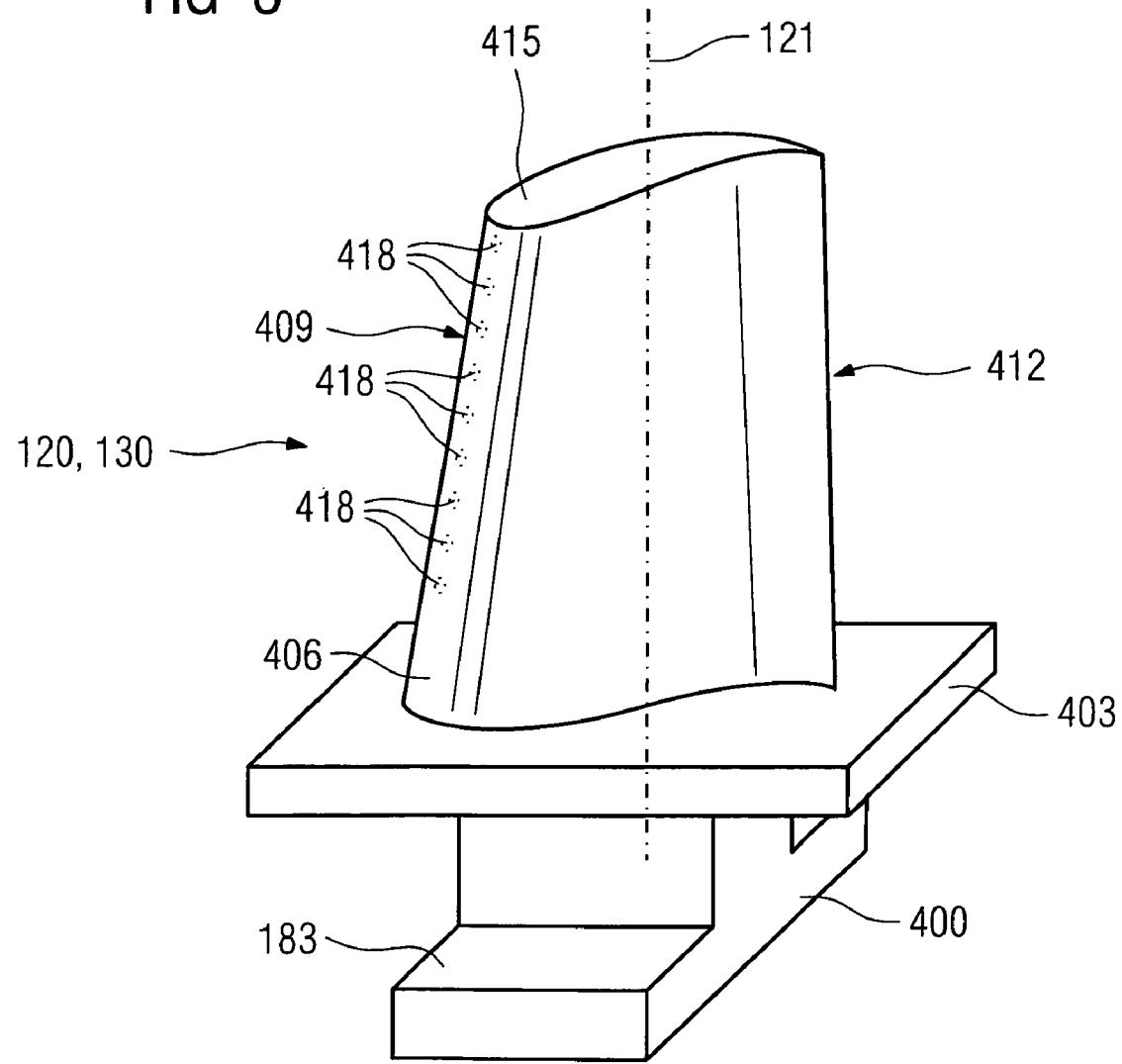

FIG 2

| Material | C | Cr | Ni | Co | Mo | W | Ta | Nb | Al | Ti | B | Zr | Hf |
|---|---|---|---|---|---|---|---|---|---|---|---|---|---|
| Ni-based precision casting alloys | | | | | | | | | | | | | |
| GTD 222 | 0.10 | 22.5 | Remainder | 19.0 | | 2.0 | 1.0 | 1.0 | 1.2 | 2.3 | 0.008 | | |
| IN 939 | 0.15 | 22.4 | Remainder | 19.0 | | 2.0 | 1.4 | 1.0 | 1.9 | 3.7 | 0.009 | 0.10 | |
| IN 6203 DS | 0.15 | 22.0 | Remainder | 19.0 | | 2.0 | 1.1 | 0.8 | 2.3 | 3.5 | 0.010 | 0.10 | 0.75 |
| Udimet 500 | 0.10 | 18.0 | Remainder | 18.5 | 4.0 | | | | 2.9 | 2.9 | 0.006 | 0.05 | |
| IN 738 LC | 0.10 | 16.0 | Remainder | 8.5 | 1.7 | 2.6 | 1.7 | 0.9 | 3.4 | 3.4 | 0.010 | 0.10 | |
| SC 16 | <0.01 | 16.0 | Remainder | | 3.0 | | 3.5 | | 3.5 | 3.5 | <0.005 | <0.008 | |
| Rene 80 | 0.17 | 14.0 | Remainder | 9.5 | 4.0 | 4.0 | | | 3.0 | 5.0 | 0.015 | 0.03 | |
| GTD 111 | 0.10 | 14.0 | Remainder | 9.5 | 1.5 | 3.8 | 2.8 | | 3.0 | 4.9 | 0.012 | 0.03 | |
| GTD 111 DS | | | | | | | | | | | | | |
| IN 792 CC | 0.08 | 12.5 | Remainder | 9.0 | 1.9 | 4.1 | 4.1 | | 3.4 | 3.8 | 0.015 | 0.02 | 1.00 |
| IN 792 DS | 0.08 | 12.5 | Remainder | 9.0 | 1.9 | 4.1 | 4.1 | | 3.4 | 3.8 | 0.015 | 0.02 | 1.50 |
| MAR M 002 | 0.15 | 9.0 | Remainder | 10.0 | | 10.0 | 2.5 | | 5.5 | 1.5 | 0.015 | 0.05 | 1.40 |
| MAR M 247 LC DS | 0.07 | 8.1 | Remainder | 9.2 | 0.5 | 9.5 | 3.2 | | 5.6 | 0.7 | 0.015 | 0.02 | |
| CMSX-2 | <.006 | 8.0 | Remainder | 4.6 | 0.6 | 8.0 | 6.0 | | 5.6 | 1.0 | <.003 | <.0075 | 0.10 |
| CMSX-3 | <.006 | 8.0 | Remainder | 4.6 | 0.6 | 8.0 | 6.0 | | 5.6 | 1.0 | <.003 | <.0075 | 0.10 |
| CMSX-4 | | 6.0 | Remainder | 10.0 | 0.6 | 6.0 | 6.0 | | 5.6 | 1.0 | | Re=3.0 | 0.10 |
| CMSX-6 | <.015 | 10.0 | Remainder | 5.0 | 3.0 | <.10 | 2.0 | <.10 | 4.9 | 4.8 | <.003 | <.0075 | |
| PWA 1480 SX | <.006 | 10.0 | Remainder | 5.0 | | 4.0 | 12.0 | | 5.0 | 1.5 | <.0075 | <.0075 | |
| PWA 1483 SX | 0.07 | 12.2 | Remainder | 9.0 | 1.9 | 3.8 | 5.0 | | 3.6 | 4.2 | 0.0001 | 0.002 | |
| Co-based precision casting alloys | | | | | | | | | | | | | |
| FSX 414 | 0.25 | 29.0 | 10 | Remainder | | 7.5 | | | | | 0.010 | | |
| X 45 | 0.25 | 25.0 | 10 | Remainder | | 8.0 | | | | | 0.010 | | |
| ECY 768 | 0.65 | 24.0 | 10 | 51.7 | | 7.5 | 4.0 | | 0.25 | 0.3 | 0.010 | 0.05 | |
| MAR-M-509 | 0.65 | 24.5 | 11 | Remainder | | 7.5 | 4 | | | 0.3 | 0.010 | 0.60 | |
| CM 247 | 0.07 | 8.3 | Remainder | 10.0 | 0.5 | 9.5 | 3.2 | | 5.5 | 0.7 | | | 1.5 |

Chemical composition in %

CERAMIC POWDER, CERAMIC LAYER AND LAYER SYSTEM WITH PYROCHLORE PHASE AND OXIDES

CROSS REFERENCE TO RELATED APPLICATIONS

The present application claims the benefit of the provisional patent application filed on May 7, 2007, and assigned application No. 60/928,086, and of European Patent Office application No. 07009129 EP filed May 7, 2007, all of the applications are incorporated by reference herein in their entirety.

FIELD OF INVENTION

The invention relates to a ceramic powder, to a ceramic layer and to a layer system with pyrochlores and oxides.

BACKGROUND OF INVENTION

Such a layer system has a substrate comprising a metal alloy based on nickel or cobalt. Such products are used especially as a component of a gas turbine, in particular as gas turbine blades or heat shields. The components are exposed to a hot gas flow of aggressive combustion gases. They must therefore be able to withstand heavy thermal loads. It is furthermore necessary for these components to be oxidation- and corrosion-resistant. Especially moving components, for example gas turbine blades, but also static components, are furthermore subject to mechanical requirements. The power and efficiency of a gas turbine, in which there are components exposable to hot gas, increase with a rising operating temperature. In order to achieve a high efficiency and a high power, those gas turbine components which are particularly exposed to high temperatures are coated with a ceramic material. This acts as a thermal insulation layer between the hot gas flow and the metallic substrate.

The metallic base body is protected against the aggressive hot gas flow by coatings. In this context, modern components usually comprise a plurality of coatings which respectively fulfill specific functions. The system is therefore a multilayer system.

Since the power and efficiency of gas turbines increase with a rising operating temperature, attempts are continually being made to achieve a higher performance of gas turbines by improving the coating system.

EP 0 944 746 B1 discloses the use of pyrochlores as a thermal insulation layer. The use of a material as a thermal insulation layer, however, requires not only good thermal insulation properties but also good mechanical properties and good bonding to the substrate.

EP 0 992 603 A1 discloses a thermal insulation layer system of gadolinium oxide and zirconium oxide, which does not have a pyrochlore structure.

SUMMARY OF INVENTION

It is therefore an object of the invention to provide a ceramic powder, a ceramic layer and a layer system having good thermal insulation properties and good bonding to the substrate and therefore a long lifetime of the entire layer system.

The invention is based on the discovery that in order to achieve a long lifetime, the entire system must be considered as a whole and individual layers or some layers together should not be considered and optimized separately from one another.

The object is achieved by a ceramic powder, a ceramic layer and a layer system as claimed in independent claims.

The dependent claims describe further advantageous measures, which may advantageously be combined in any desired way.

BRIEF DESCRIPTION OF THE DRAWINGS

FIG. 1 shows a layer system according to the invention,
FIG. 2 shows a list of superalloys,
FIG. 3 shows a perspective view of a turbine blade.

DETAILED DESCRIPTION OF INVENTION

Figure 4:
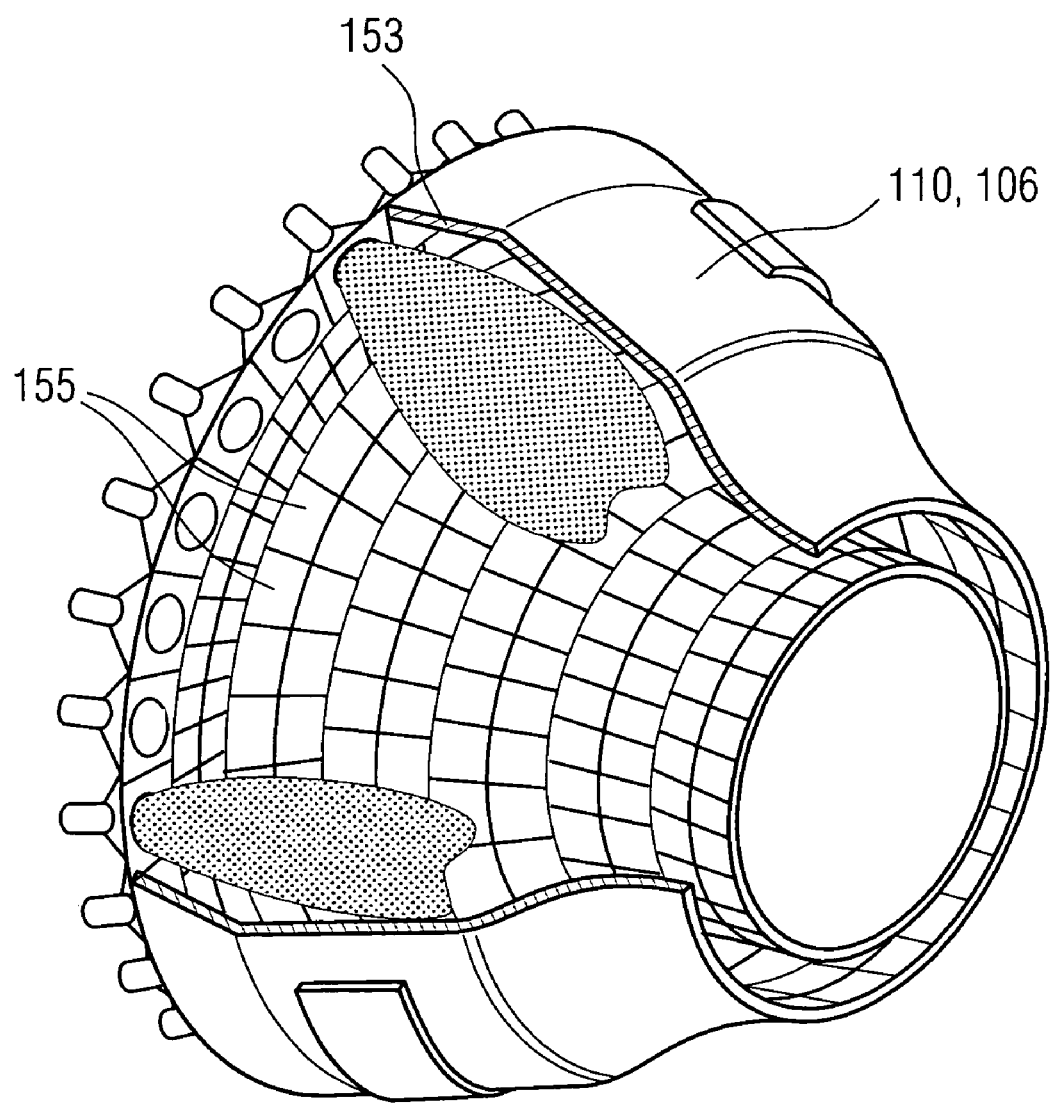
FIG. 4 shows a perspective view of a combustion chamber.

The ceramic pyrochlore powder according to the invention of the general formula $A_2B_2O_7$ has as a further constituent an oxide $C_rO_s$ of a metal (O=oxygen; B=Hf, Zr, Ti, Sn; A=Gd, Sm, Nd, La, Y). The metal constituent of the secondary oxide is denoted here by C.

The composition of the ceramic powder will also be explained by way of example with the aid of the composition of the ceramic layer 13 (FIG. 1). In general, departures from the stoichiometry of the general pyrochlore structure $A_2B_2O_7$ may always occur.

Pyrochlore structures in which A=gadolinium are preferably used, since good to very good thermal insulation properties are achieved in this case. Depending on the application, a hafnate or a zirconate will be used so that B=hafnium or zirconium.

Gadolinium hafnate or gadolinium zirconate will thus preferably be used.

Gadolinium hafnate as the powder comprises from 43 wt % to 50 wt %, preferably from 44.7 wt % to 47.7 wt % of gadolinium oxide, the remainder being hafnium oxide and optionally the secondary oxides, preferably only zirconium oxide, and the sintering aids.

Gadolinium zirconate as the powder comprises from 56 wt % to 63 wt %, preferably from 58 wt % to 61 wt % of gadolinium oxide, the remainder being zirconium oxide and optionally the secondary oxides, preferably only hafnium oxide, and sintering aids.

The ceramic layer 13 (FIG. 1) or the ceramic powder comprises a pyrochlore phase of the general empirical formula $A_xB_yO_z$ with x, y≈2, z≈7 and a secondary oxide $C_rO_s$ with r, s>0. The secondary oxide $C_rO_s$ is in this case deliberately added to the powder and is thus significantly above the metrological detection limit of the secondary oxide, i.e. it has at least two times the value of the detection limit of the secondary oxide.

The secondary oxide has in particular a proportion of from 0.5 wt % to 10 wt %, more particularly a proportion of from 1 wt % to 10 wt %. The maximum proportion of the secondary oxide is preferably 8 wt %, in particular at most 6 wt % and more particularly between 5 wt % and 7 wt %. The maximum proportion of the secondary oxide is likewise preferably 3 wt %, in particular at most 2 wt % and more particularly between 1.5 wt % and 2.5 wt %. In particular, the ceramic powder consists of at least one pyrochlore phase and at least one secondary oxide.

For the secondary oxide, the oxide of B may be used (C=B) or not (C≠B). If C=B, then a high phase stability of the pyrochlore phase is ensured. If B≠C however, then an increase in the mechanical strength is achieved.

Hafnium oxide or zirconium oxide therefore preferably used, since they are particularly stable at high temperatures and they do not entail diffusion and therefore phase modification of the pyrochlore structure.

The ceramic layer 13 or the ceramic powder preferably comprises only one pyrochlore phase, so that thermal stresses do not occur between different phases when used with strongly alternating temperatures.

A mixture of only two pyrochlore phases may likewise be used, i.e. for example a powder mixture of $Gd_2Zr_2O_7$ and $Gd_2Hf_2O_7$, in order to combine the improved thermal insulation properties of one pyrochlore phase with the better thermal expansion coefficients of the other pyrochlore phase. This is the case, in particular, for gadolinium zirconate and gadolinium hafnate.

The pyrochlore phase may likewise preferably be present as a mixed crystal, so that good mixing will have already taken place here or phase stability is provided. This is the case, in particular, for $Gd_2(Hf_xZr_y)O_7$ with $x+y\approx2$.

The ceramic layer 13 or the ceramic powder preferably comprises only one secondary oxide. The secondary oxide may constitute hafnium oxide or zirconium oxide. Zirconium oxide is preferably used when a hafnate is employed as the pyrochlore phase. A zirconium oxide is preferably used when a hafnate is employed for the pyrochlore phase.

Two secondary oxides, in particular hafnium oxide and zirconium oxide, may likewise be used so that the mechanical properties are improved further.

The secondary oxides may in this case be present only as an oxide, so that there is a secondary phase here which leads to mechanical reinforcement, or they are present as a mixed crystal with one another or with the pyrochlore phase, so that the thermal conductivity can in this way be reduced further by the stresses thereby generated in the lattice.

In order to draw advantages from both presentation types of the secondary oxides, the secondary oxide or oxides may be present both as an oxide or as a mixed crystal in the pyrochlore phase.

Preferably, B≠C.

A pyrochlore powder of gadolinium zirconate, in particular $Gd_2Zr_2O_7$, thus comprises hafnium oxide in particular with a proportion of from 1.5 wt % to 2.5 wt %, in particular 2 wt %.

Gadolinium hafnate, in particular $Gd_2Hf_2O_7$, preferably comprises zirconium oxide in particular with a proportion of from 5 wt % to 7 wt %, in particular up to 6 wt %.

The pyrochlore or pyrochlores preferably have the following optional constituents as sintering aids:
Up to 0.05 wt % silicon oxide,
Up to 0.1 wt % calcium oxide,
Up to 0.1 wt % magnesium oxide,
Up to 0.1 wt % iron oxide,
Up to 0.1 wt % aluminum oxide and
Up to 0.08 wt % titanium oxide.

During the coating or during subsequent use at higher temperatures, these sintering aids lead to dense and stable layers.

No other sintering aids are preferably used.

FIG. 1 shows a layer system 1 according to the invention.

The layer system 1 comprises a metallic substrate 4 which, in particular for components at high temperatures, consists of a nickel- or cobalt-based superalloy (FIG. 2). There is preferably a metallic bonding layer 7 directly on the substrate 4, in particular of the NiCoCrAlX type, which preferably comprises (11-13) wt % cobalt, (20-22) wt % chromium (10.5-11.5) wt % aluminum, (0.3-0.5) wt % yttrium, (1.5-2.5) wt % rhenium and the remainder nickel, or which preferably comprises (24-26) wt % cobalt, (16-18) wt % chromium (9.5-11) wt % aluminum, (0.3-0.5) wt % yttrium, (1-1.8) wt % rhenium and the remainder nickel, and in particular consists thereof.

An aluminum oxide layer is preferably formed already on this metallic bonding layer 7 before further ceramic layers are applied, or such an aluminum oxide layer (TGO) is formed during operation.

There is preferably an inner ceramic layer 10, preferably a fully or partially stabilized zirconium oxide layer, on the metallic bonding layer 7 or on the aluminum oxide layer (not shown) or on the substrate 4. Yttrium-stabilized zirconium oxide is preferably used, with 6 wt %-8 wt % of yttrium preferably being employed. Calcium oxide, cerium oxide and/or hafnium oxide may likewise be used to stabilize zirconium oxide. The zirconium oxide is preferably applied as a plasma-sprayed layer, although it may also preferably be applied as a columnar structure by means of electron beam deposition (EBPVD).

An outer ceramic layer 13 of the ceramic powder is applied on the stabilized zirconium oxide layer 10 or on the metallic bonding layer 7 or on the substrate. The layer 13 preferably constitutes the outermost layer, which is exposed directly to the hot gas. The layer 13 consists mainly of a pyrochlore phase, i.e. it comprises at least 90 wt % of the pyrochlore phase which preferably consists of either $Gd_2Hf_2O_7$ or $Gd_2Zr_2O_7$.

The secondary oxides are distributed in the layer 13, preferably homogeneously distributed.

The layer thickness of the inner layer 10 is preferably between 10% and 50% in particular between 10% and 40%, of the total layer thickness of the inner layer 10 plus the outer layer 13. The inner ceramic layer 10 preferably has a thickness of from 100 μm to 200 μm, in particular 150 μm±10%. The total layer thickness of the inner layer 10 plus the outer layer 13 is preferably 300 μm or preferably 450 μm. The maximum total layer thickness is advantageously 600 μm or preferably at most 800 μm. The layer thickness of the inner layer 10 is preferably between 10% and 40% or between 10% and 30% of the total layer thickness. It is likewise advantageous for the layer thickness of the inner layer 10 to comprise from 10% to 20% of the total layer thickness. It is likewise preferable for the layer thickness of the inner layer 10 to be between 20% and 50% or between 20% and 40% of the total layer thickness. Advantageous results are likewise achieved if the contribution of the inner layer 10 to the total layer thickness is between 20% and 30%. The layer thickness of the inner layer 10 is preferably from 30% to 50% of the total layer thickness. It is likewise advantageous for the layer thickness of the inner layer 10 to comprise from 30% to 40% of the total layer thickness. It is likewise preferable for the layer thickness of the inner layer 10 to be between 40% and 50% of the total layer thickness.

For short-term use at high temperatures of the layer system, the outer layer 13 may preferably be configured to be thinner than the inner layer 10, i.e. the layer thickness of the outer layer 13 is at most 40% of the total layer thickness of the inner layer 10 plus the outer layer 13.

The layer system preferably consists of the substrate 4, the metallic layer 7, the inner ceramic layer 10 and the outer ceramic layer 13, and optionally the TGO.

FIG. 3 shows a perspective view of a rotor blade 120 or guide vane 130 of a turbomachine, which extends along a longitudinal axis 121.

The turbomachine may be a gas turbine of an aircraft or of a power plant for electricity generation, a steam turbine or a compressor.

The blade 120, 130 comprises, successively along the longitudinal axis 121, a fastening zone 400, a blade platform 403 adjacent thereto as well as a blade surface 406. As a guide vane 130, the vane 130 may have a further platform (not shown) at its vane tip 415.

A blade root 183 which is used to fasten the rotor blades 120, 130 on a shaft or a disk (not shown) is formed in the fastening zone 400. The blade root 183 is configured, for example, as a hammerhead. Other configurations as a firtree or dovetail root are possible. The blade 120, 130 comprises a leading edge 409 and a trailing edge 412 for a medium which flows past the blade surface 406.

In conventional blades 120, 130, for example solid metallic materials, in particular superalloys, are used in all regions 400, 403, 406 of the blade 120, 130. Such superalloys are known for example from EP 1 204 776 B1, EP 1 306 454, EP 1 319 729 A1, WO 99/67435 or WO 00/44949. The blades 120, 130 may in this case be manufactured by a casting method, also by means of directional solidification, by a forging method, by a machining method or combinations thereof.

Workpieces with a monocrystalline structure or structures are used as components for machines which are exposed to heavy mechanical, thermal and/or chemical loads during operation. Such monocrystalline workpieces are manufactured, for example, by directional solidification from the melts. These are casting methods in which the liquid metal alloy is solidified to form a monocrystalline structure, i.e. to form the monocrystalline workpiece, or is directionally solidified. Dendritic crystals are in this case aligned along the heat flux and form either a rod crystalline grain structure (columnar, i.e. grains which extend over the entire length of the workpiece and in this case, according to general terminology usage, are referred to as directionally solidified) or a monocrystalline structure, i.e. the entire workpiece consists of a single crystal. It is necessary to avoid the transition to globulitic (polycrystalline) solidification in these methods, since nondirectional growth will necessarily form transverse and longitudinal grain boundaries which negate the beneficial properties of the directionally solidified or monocrystalline component.

When directionally solidified structures are referred to in general, this is intended to mean both single crystals which have no grain boundaries or at most small-angle grain boundaries, and also rod crystal structures which, although they do have grain boundaries extending in the longitudinal direction, do not have any transverse grain boundaries. These latter crystalline structures are also referred to as directionally solidified structures.

Such methods are known from U.S. Pat. No. 6,024,792 and EP 0 892 090 A1.

The blades 120, 130 may likewise have coatings against corrosion or oxidation, for example (MCrAlX; M is at least one element from the group ion (Fe), cobalt (Co), nickel (Ni), X is an active element and stands for yttrium (Y) and/or silicon and/or at least one rare earth element, or hafnium (Hf)). Such alloys are known from EP 0 486 489 B1, EP 0 786 017 B1, EP 0 412 397 B1 or EP 1 306 454 A1.

On the MCrAlX layer, there may furthermore be a ceramic thermal insulation layer 13 according to the invention. Rod-shaped grains are produced in the thermal insulation layer by suitable coating methods, for example electron beam deposition (EB-PVD).

Refurbishment means that components 120, 130 may need to have protective layers taken off (for example by sandblasting) after their use. The corrosion and/or oxidation layers or products are then removed. Optionally, cracks in the component 120, 130 are also repaired. The component 120, 130 is then recoated and the component 120 is used again.

The blade 120, 130 may be designed to be a hollow or solid. If the blade 120, 130 is intended to be cooled, it will be hollow and optionally also comprise film cooling holes 418 (indicated by dashes).

Figure 5:
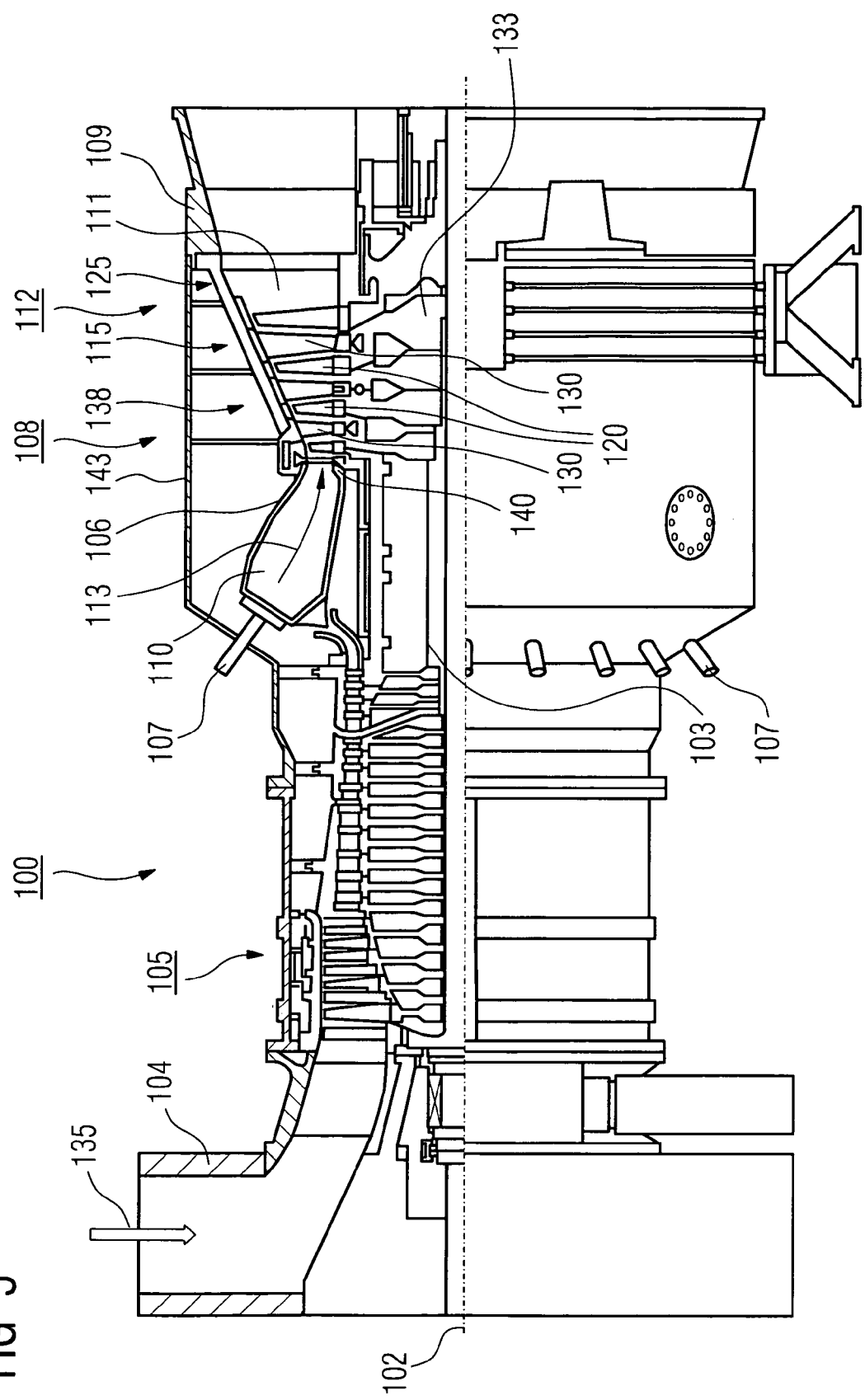
FIG. 5 shows a gas turbine.

FIG. 4 shows a combustion chamber 110 of a gas turbine 100 (FIG. 5). The combustion chamber 110 is designed for example as a so-called ring combustion chamber in which a multiplicity of burners 107, which produce flames 156 and are arranged in the circumferential direction around a rotation axis 102, open into a common combustion chamber space 154. To this end, the combustion chamber 110 as a whole is designed as an annular structure which is positioned around the rotation axis 102.

In order to achieve a comparatively high efficiency, the combustion chamber 110 is designed for a relatively high temperature of the working medium M, i.e. about 1000° C. to 1600° C. In order to permit a comparatively long operating time even under these operating parameters which are unfavorable for the materials, the combustion chamber wall 153 is provided with an inner lining formed by heat shield elements 155 on its side facing the working medium M. Each heat shield element 155 made of an alloy is equipped with a particularly heat-resistant protective layer (MCrAlX layer and/or ceramic coating) on the working medium side, or is made of refractory material (solid ceramic blocks). These protective layers may be similar to the turbine blades, i.e. for example MCrAlX means: M is at least one element from the group ion (Fe), cobalt (Co), nickel (Ni), X is an active element and stands for yttrium (Y) and/or silicon and/or at least one rare earth element, or hafnium (Hf). Such alloys are known from EP 0 486 489 B1, EP 0 786 017 B1, EP 0 412 397 B1 or EP 1 306 454 A1.

Refurbishment means that heat shield elements 155 may need to have protective layers taken off (for example by sandblasting) after their use. The corrosion and/or oxidation layers or products are then removed. Optionally, cracks in the heat shield element 155 are also repaired. The heat shield elements 155 are then recoated and the heat shield elements 155 are used again.

Owing to the high temperatures inside the combustion chamber 110, a cooling system may also be provided for the heat shield elements 155 or for their retaining elements. The heat shield elements 155 are then hollow, for example, and optionally also have film cooling holes (not shown) opening into the combustion chamber space 154.

FIG. 5 shows a gas turbine 100 by way of example in a partial longitudinal section. The gas turbine 100 internally comprises a rotor 103, which will also be referred to as the turbine rotor, mounted so as to rotate about a rotation axis 102 and having a shaft 101. Successively along the rotor 103, there are an intake manifold 104, a compressor 105, an e.g. toroidal combustion chamber 110, in particular a ring combustion chamber, having a plurality of burners 107 arranged coaxially, a turbine 108 and the exhaust manifold 109. The ring combustion chamber 110 communicates with an e.g. annular hot gas channel 111. There, for example, four successively connected turbine stages 112 form the turbine 108. Each turbine stage 112 is formed for example by two blade rings. As seen in the flow direction of a working medium 113, a guide vane row 115 is followed in the hot gas channel 111 by a row 125 formed by rotor blades 120.

The guide vanes 130 are fastened on an inner housing 138 of a stator 143 while the rotor blades 120 of a row 125 are fastened on the rotor 103, for example by means of a turbine disk 133. Coupled to the rotor 103, there is a generator or a work engine (not shown).

During operation of the gas turbine 100, air 135 is taken in and compressed by the compressor 105 through the intake manifold 104. The compressed air provided at the turbine-side end of the compressor 105 is delivered to the burners 107 and mixed there with a fuel. The mixture is then burnt to form the working medium 113 in the combustion chamber 110. From there, the working medium 113 flows along the hot gas channel 111 past the guide vanes 130 and the rotor blades 120. At the rotor blades 120, the working medium 113 expands by imparting momentum, so that the rotor blades 120 drive the rotor 103 and the work engine coupled to it.

During operation of the gas turbine 100, the components exposed to the hot working medium 113 experience thermal loads. Apart from the heat shield elements lining the ring combustion chamber 110, the guide vanes 130 and rotor blades 120 of the first turbine stage 112, as seen in the flow direction of the working medium 113, are heated the most. In order to withstand the temperatures prevailing there, they may be cooled by means of a coolant. Substrates of the components may likewise comprise a directional structure, i.e. they are monocrystalline (SX structure) or comprise only longitudinally directed grains (DS structure). Iron-, nickel- or cobalt-based superalloys are for example used as material for the components, in particular for the turbine blades 120, 130 and components of the combustion chamber 110. Such superalloys are known for example from EP 1 204 776 B1, EP 1 306 454, EP 1 319 729 A1, WO 99/67435 or WO 00/44949.

The guide vanes 130 comprise a guide vane root (not shown here) facing the inner housing 138 of the turbine 108, and a guide vane head lying opposite the guide vane root. The guide vane head faces the rotor 103 and is fixed on a fastening ring 140 of the stator 143.

The invention claimed is:

1. A ceramic powder, comprising:
   a pyrochlore phase of the empirical formula $A_xB_yO_z$ with x, y≈2, z≈7; and
   a secondary oxide $C_rO_s$ with r, s>0.

2. The ceramic powder as claimed in claim 1, wherein the secondary oxide has a proportion from 0.5 wt % to 10 wt %.

3. The ceramic powder as claimed in claim 1, wherein A is gadolinium.

4. The ceramic powder as claimed in claim 1, wherein B is hafnium.

5. The ceramic powder as claimed in claim 1, wherein B is zirconium.

6. The ceramic powder as claimed in claim 1, wherein C≈B.

7. The ceramic powder as claimed in claim 1, wherein C is B.

8. The ceramic powder as claimed in claim 1, wherein C is hafnium.

9. The ceramic powder as claimed in claim 1, wherein C is zirconium.

10. The ceramic powder as claimed in claim 1, wherein the secondary oxide has at most 8 wt %.

11. The ceramic powder as claimed in claim 1, wherein the secondary oxide is hafnium oxide or zirconium oxide.

12. The ceramic powder as claimed in claim 1, further comprising at least one sintering aid selected from the group consisting of
   up to 0.05 wt % of silicon oxide,
   up to 0.1 wt % of calcium oxide,
   up to 0.1 wt % of magnesium oxide,
   up to 0.1 wt % of iron oxide,
   up to 0.1 wt % of aluminum oxide,
   up to 0.08 wt % of titanium oxide, and
   a combination thereof.

13. The ceramic powder as claimed in claim 1, wherein the powder has at least 92 wt % of the pyrochlore phase.

14. The ceramic powder as claimed in claim 1, wherein the ceramic powder has only one pyrochlore phase or has only two pyrochlore phases.

15. The ceramic powder as claimed in claim 1, further comprising a mixed crystal as a pyrochlore phase.

16. The ceramic powder as claimed in claim 1, wherein the ceramic powder has only one secondary oxide $C_rO_s$ or only two secondary oxides, $C_rO_s$ and $C'_rO_{s'}$.

17. The ceramic powder as claimed in claim 1, wherein the secondary oxide or the secondary oxides are entirely present as a mixed crystal.

18. The ceramic powder as claimed in claim 1, wherein pyrochlore phases is $A_2B_2O_7$.

* * * * *